US012770846B2

(12) United States Patent
Del Rio Perez et al.

(10) Patent No.: US 12,770,846 B2
(45) Date of Patent: Oct. 20, 2026

(54) HIGH PURITY SULFUR-DOPED COPPER SPUTTERING TARGET ASSEMBLY AND METHOD FOR PRODUCING SAME

(71) Applicant: TOSOH SMD, INC., Grove City, OH (US)

(72) Inventors: Eduardo Del Rio Perez, Dublin, OH (US); Harrison Collin Whitt, Grove City, OH (US)

(73) Assignee: TOSOH SMD, INC., Grove City, OH (US)

( * ) Notice: Subject to any disclaimer, the term of this patent is extended or adjusted under 35 U.S.C. 154(b) by 224 days.

(21) Appl. No.: 18/109,003

(22) Filed: Feb. 13, 2023

(65) Prior Publication Data

US 2023/0260769 A1 Aug. 17, 2023

Related U.S. Application Data

(60) Provisional application No. 63/309,009, filed on Feb. 11, 2022.

(51) Int. Cl.

| | |
|---|---|
| ***H01J 37/34*** | (2006.01) |
| ***B22D 7/00*** | (2006.01) |
| ***C23C 14/34*** | (2006.01) |

(52) U.S. Cl.
CPC .......... *H01J 37/3426* (2013.01); *B22D 7/005* (2013.01); *C23C 14/3407* (2013.01); *C23C 14/3414* (2013.01); *H01J 37/3491* (2013.01)

(58) Field of Classification Search
CPC .............. H01J 37/3426; H01J 37/3491; C23C 14/3407; C23C 14/3414; B22D 7/005
USPC ................ 204/298.12, 298.13; 148/553, 554
See application file for complete search history.

(56) References Cited

U.S. PATENT DOCUMENTS

2004/0072009 A1 4/2004 Segal et al.
2007/0251818 A1* 11/2007 Yi ............................ C22C 9/00 204/298.12

FOREIGN PATENT DOCUMENTS

JP 2001-240923 * 9/2001
JP 2011225986 A1 11/2011
WO WO 2011/066375 * 6/2011

OTHER PUBLICATIONS

Machine Translation JP 2001-240923 (Year: 2001).*
Office Action in U.S. Appl. No. 19/017,900, mailed Feb. 13, 2026, 16 pages.

* cited by examiner

*Primary Examiner* — Rodney G McDonald
(74) *Attorney, Agent, or Firm* — McDonald Hopkins LLC

(57) ABSTRACT

Provided are copper and copper alloy sputtering targets and sputtering target assemblies, including copper-sulfur sputtering targets, and systems and methods thereof. The copper and copper alloy sputtering targets, including copper-sulfur sputtering targets may have one or more (or all) of the following properties: high purity, uniform composition and distribution, increased or requisite mechanical stability to provide joining mechanisms, and the like. In an embodiment, the sulfur-doped copper alloy compositions and sputtering targets may have a purity of 99.999 wt % or more and/or a uniform composition of sulfur up to 5 wt %.

22 Claims, 8 Drawing Sheets

163

HIGH PURITY SULFUR-DOPED COPPER SPUTTERING TARGET ASSEMBLY AND METHOD FOR PRODUCING SAME

CROSS REFERENCE TO RELATED APPLICATIONS

This application claims priority to U.S. Patent Application No. 63/309,009, filed on Feb. 11, 2022, entitled "High Purity Sulfur-Doped Copper Sputtering Target Manufacturing Process," which is incorporated herein by reference in its entirety.

TECHNICAL FIELD

The present invention relates to systems and methods for producing sulfur-doped copper sputtering targets and, more particularly, to sulfur-doped copper sputtering targets having high purity and uniform alloy distribution.

BACKGROUND

Copper and copper alloy vias and interconnects comprise a large portion of the metal lines created in semiconductor and integrated circuit applications which are used produce electronic devices. The properties of the copper and copper alloys are important for the performance of the electronic devices and the manufacturability thereof. These sputtering target assemblies can be used to provide appropriate deposited thin films for semiconductors and integrated circuits using, for example, physical vapor deposition (PVD) processes. Due to the increasingly small sizes and geometry of modern semiconductors and integrated circuits, however, the components require high precision and leave no room for defects, which can otherwise render the system (and electronic devices) nonfunctional.

SUMMARY

The following presents a summary of this disclosure to provide a basic understanding of some aspects. This summary is intended to neither identify key or critical elements nor define any limitations of embodiments or claims. This summary may provide a simplified overview of some aspects that may be described in greater detail in other portions of this disclosure. Furthermore, any of the described aspects may be isolated or combined with other described aspects without limitation to the same effect as if they had been described separately and in every possible combination explicitly.

According to one aspect of the present invention, a method for producing a copper-sulfur alloy sputtering target assembly includes, providing raw materials for forming a sputtering target, wherein the raw materials comprise copper, and the raw materials further comprise sulfur and/or sulfur compounds, melting the raw materials to produce a molten alloy, casting the molten alloy composition to produce an ingot having a predetermined uniform sulfur distribution value throughout the ingot, applying thermomechanical processing at a predetermined temperature to the ingot to produce a sputtering target blank, and forming a sputtering target assembly by joining the sputtering target blank to a backing plate, wherein the molten alloy and the ingot have a purity of about 99.999 wt % or higher.

In another aspect of the invention, the predetermined temperature of the thermomechanical processing is greater than about 450° C.

In another aspect of the invention, the predetermined temperature of the thermomechanical processing is between about 700-850° C.

In another aspect of the invention, the raw materials are melted by vacuum induction melting.

In another aspect of the invention, the sputtering target blank is joined to the backing plate using at least one or more of solder bonding, brazing, mechanical methods, or diffusion bonding.

In another aspect of the invention, a bond strength between the sputtering target blank and the backing plate of the sputtering target assembly is between about 25 ksi-35 ksi.

In another aspect of the invention, the backing plate may be comprised of at least one of copper, copper alloys, copper-chromium based alloys, and/or copper-nickel-silicon-chromium based alloys.

In another aspect of the invention, the raw material is comprised of up to about 5 wt % sulfur.

In another aspect of the invention, the sulfur is uniformly distributed in the molten raw material, ingot, and sputtering target.

In another aspect of the invention, the melting step is repeated to produce an ingot having predetermined sulfur concentration value range, a predetermined variance in the sulfur concentration values from a predetermined sulfur concentration value, or the sulfur concentration values are less than or equal to about a predetermined percent difference threshold for sulfur concentration values throughout the ingot.

In another aspect of the invention, the melting step is repeated to produce an ingot having a predetermined sulfur concentration value range, a predetermined variance in the sulfur concentration values from a predetermined sulfur concentration value, and a percentage difference for the sulfur concentration values is less than or equal to about a predetermined percent difference threshold for sulfur concentration values throughout the ingot.

In another aspect of the invention, the predetermined sulfur concentration value range is between and includes about 0.35-0.65 wt % sulfur throughout the ingot, the predetermined variance in the sulfur concentration values is about 15% or less, and predetermined percent difference threshold for sulfur concentration values is 30% or less.

In another aspect of the invention, the predetermined variance in the sulfur concentration values is about 10% or less, and predetermined percent difference threshold for sulfur concentration values is about 15% or less.

In another aspect of the invention, the thermomechanical processing step is repeated until the overall strain condition in the sputtering target blank reaches a predetermined value, and the thermomechanical processing includes one or both of pressing and rolling.

In another aspect of the invention, the predetermined value of the overall strain condition in the sputtering target is between about 70-90%.

In another aspect of the invention, the thermomechanical processing increases the overall strain condition within the sputtering target blank by at least about 10% during each repetition of the thermomechanical processing, In another aspect of the invention, the thermomechanical processing increases the overall strain condition within the sputtering target blank by about 15-20% during each repetition of the thermomechanical processing.

In yet another aspect of the invention, a sputtering target assembly comprising the sputtering target blank and backing plate produced as discussed above.

In a further another aspect of the invention, a sputtering target assembly comprises a sputtering target blank and a backing plate, the sputtering target blank is comprised of copper, and the sputtering target blank is further comprised of sulfur and/or sulfur compounds, the backing plate is comprised of at least one of copper, copper alloys, copper-chromium based alloys, and/or copper-nickel-silicon-chromium based alloys, the sputtering target blank has an overall strain condition between about 70-90%, the sputtering target blank has a predetermined sulfur concentration value range between and including about 0.35-0.65 wt % throughout the sputtering target blank, a predetermined sulfur concentration value range, a predetermined variance in the sulfur concentration values from a predetermined sulfur concentration value, or a percentage difference for the sulfur concentration values is less than or equal to about a predetermined percent difference threshold for sulfur concentration values throughout the sputtering target blank, wherein the predetermined sulfur concentration value range is between and includes about 0.35-0.65 wt % sulfur throughout the sputtering target blank and the predetermined variance in the sulfur concentration values is about 15% or less throughout the sputtering target blank.

In another aspect of the invention, the predetermined percent difference threshold for sulfur concentration values is 30% or less throughout the sputtering target blank.

In another aspect of the invention, the predetermined variance in the sulfur concentration values is about 10% or less, and predetermined percent difference threshold for sulfur concentration values is about 15% or less.

In another aspect of the invention, the sputtering target blank is joined to the backing plate using at least one or more of solder bonding, brazing, mechanical methods, or diffusion bonding, and a bond strength between the sputtering target blank and the backing plate of the sputtering target assembly is between about 25 ksi-35 ksi.

The following description and the drawings disclose various illustrative aspects. Some improvements and novel aspects may be expressly identified, while others may be apparent from the description and drawings.

DESCRIPTION OF THE DRAWINGS

The accompanying drawings illustrate various systems, apparatuses, devices and methods, in which like reference characters refer to like parts throughout, and in which.

Figure 1:
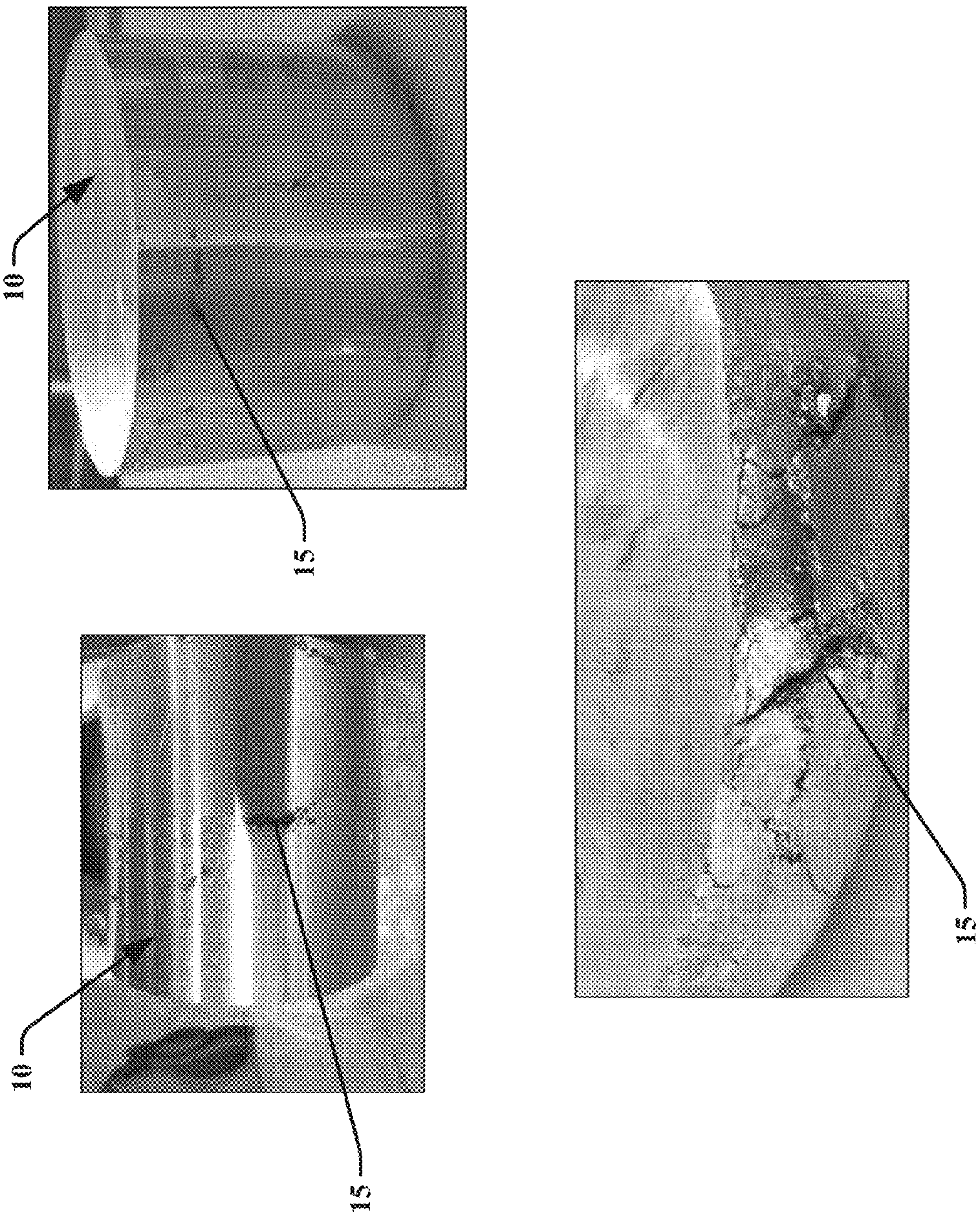
FIG. 1 shows examples of conventionally formed copper-sulfur ingots showing fracturing and inconsistent compositions that make it unsuitable for providing sputtering target blanks and assemblies.

The invention may be embodied in several forms without departing from its spirit or essential characteristics. The scope of the invention is defined in the appended claims, rather than in the specific description preceding them. All embodiments that fall within the meaning and range of equivalency of the claims are therefore intended to be embraced by the claims.

DETAILED DESCRIPTION

Reference will now be made to exemplary embodiments, examples of which are illustrated in the accompanying drawings. It is to be understood that other embodiments may be utilized and structural and functional changes may be made. Moreover, features of the various embodiments may be combined or altered. As such, the following description is presented by way of illustration only and should not limit in any way the various alternatives and modifications that may be made to the illustrated embodiments. In this disclosure, numerous specific details provide a thorough understanding of the subject disclosure. It should be understood that aspects of this disclosure may be practiced with other embodiments not necessarily including all aspects described herein, etc.

As used herein, the words "example" and "exemplary" mean an instance, or illustration. The words "example" or "exemplary" do not indicate a key or preferred aspect or embodiment. The word "or" is intended to be inclusive rather an exclusive, unless context suggests otherwise. As an example, the phrase "A employs B or C," includes any inclusive permutation (e.g., A employs B; A employs C; or A employs both B and C). As another matter, the articles "a" and "an" are generally intended to mean "one or more" unless context suggest otherwise.

As was stated above, the properties of the copper and copper alloys are important for the performance of the electronic devices and the manufacturability thereof. For example, high purity and uniform copper alloy composition dictate the capability and quality of the sputtering target assembly.

Conventionally, sulfur additions to standard copper melting processes fail to generate a sufficient composition for sputtering target blanks and assemblies because, for example, the melting processes do not provide the adequate mixing and alloying of the copper and sulfur. The addition of sulfur and formation of a melt and cast ingot without this sufficient composition cannot be further modified by thermo-mechanical processes to shape and impart the desired microstructure for the sputtering target blanks and assemblies. Furthermore, the mechanical stability of the sputtering target blank during and after thermo-mechanical processing is important to facilitate the joining mechanisms required to build and assemble the copper-sulfur alloy sputtering target blank onto a backing plate made of copper and copper alloys, for example, to construct a sputtering target assembly.

Therefore, a need exists for improved copper and copper alloy sputtering targets and assemblies, including copper-sulfur sputtering targets and assemblies, and the systems and methods thereof. The copper and copper alloy sputtering targets and assemblies, including copper-sulfur sputtering targets, may have one or more (or all) of the following properties: high purity, uniform composition and distribution, increased or requisite mechanical stability to provide joining mechanisms, and the like.

Turning to FIG. 1, shown are examples of conventionally formed copper-sulfur ingots 10. These conventionally formed copper-sulfur ingots 10 are prone to fracturing 15 and result in inconsistent compositions that make it unsuitable for providing sputtering targets. In an example, the conventional processes used to melt the copper and sulfur do not provide adequate mixing and alloying of the copper and sulfur. This combination of copper and sulfur therefore results in a non-homogenous mixture susceptible to fractures 15 and the general non-uniformity and segregation shown in FIG. 1 when cast into an ingot 10. These conventional ingots 10 cannot be further modified by thermo-mechanical processes to shape and impart a desired microstructure for a sputtering target blank. Furthermore, the conventional copper-sulfur compositions lack mechanical stability, which is needed for thermo-mechanical processing and to facilitate the joining mechanisms required to build and assemble a sputtering target blank onto a backing plate to construct a sputtering target assembly.

Described herein are copper and copper alloy sputtering target blanks, including copper-sulfur sputtering targets, and systems and methods thereof. The copper and copper alloy sputtering targets, including copper-sulfur sputtering targets, may have one or more (or all) of the following properties: high purity, uniform composition and distribution, increased or requisite mechanical stability to provide joining mechanisms, and the like. In an embodiment, the sulfur-doped copper alloy compositions and sputtering target blanks may have a purity of at least 99.999 wt % and/or a uniform composition of sulfur up to 5 wt %. The sulfur-doped copper alloy compositions and sputtering target blanks may be joined to a backing plate to form a sputtering target assembly and used to form seed and copper vias and interconnect layers in semiconductor and integrated circuit applications to produce electronic devices.

Figure 2:
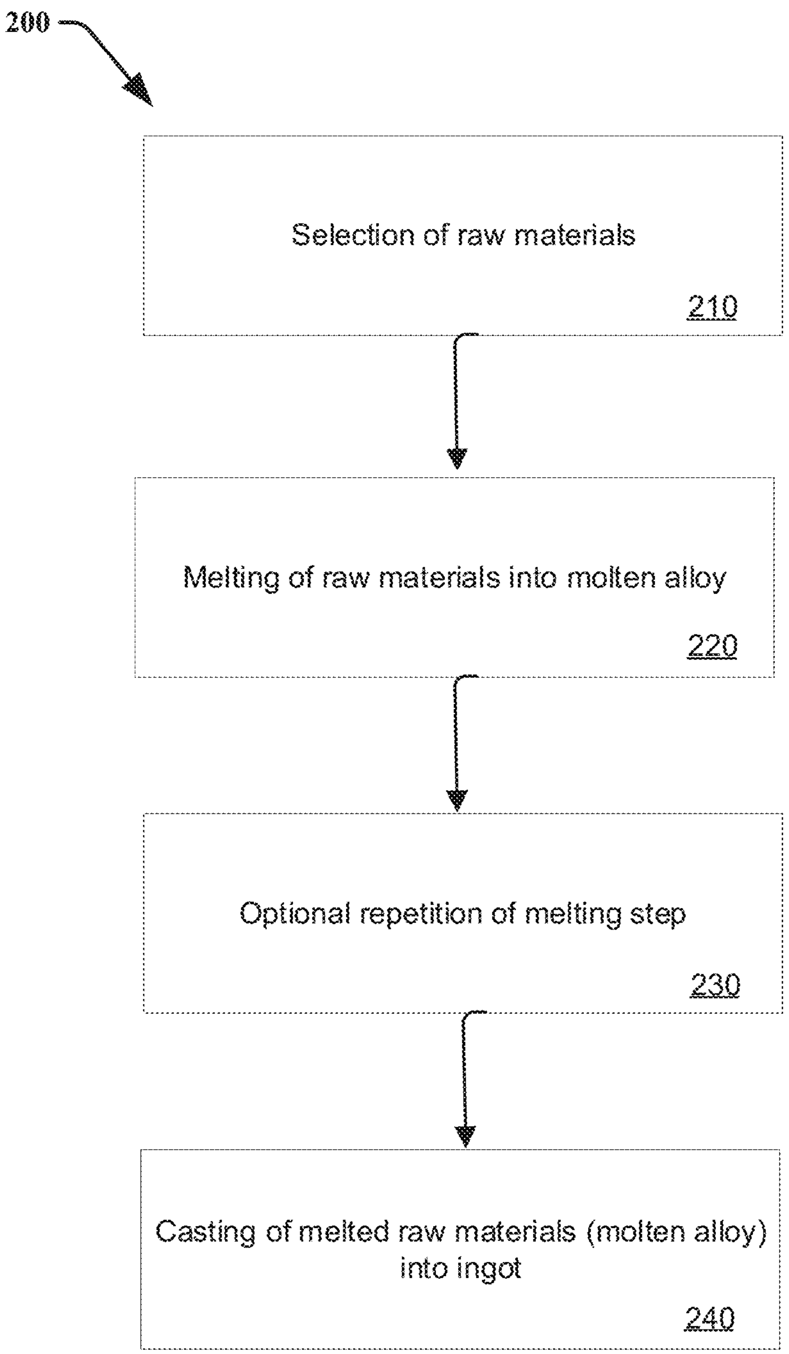
FIG. 2 is a flow diagram of an embodiment of a method of providing a copper-sulfur ingot including melting and casting steps in accordance with various disclosed aspects herein.
Figure 3:
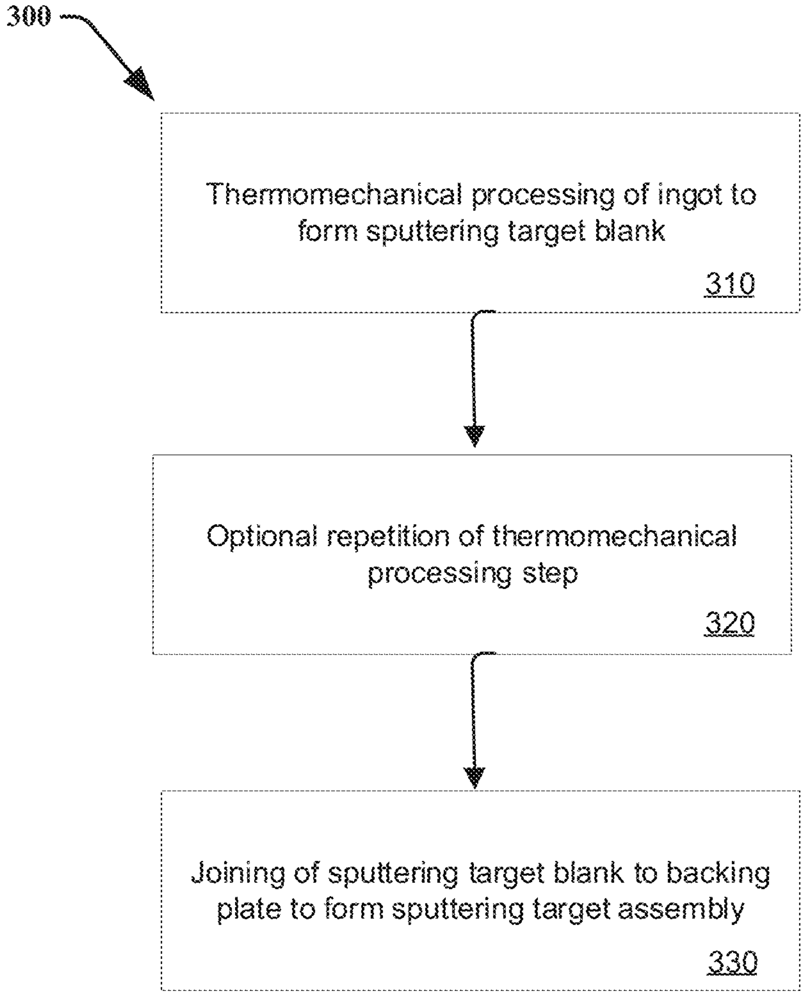
FIG. 3 is a flow diagram of an embodiment of a method of providing a copper-sulfur sputtering target blank and assembly from an ingot including thermo-mechanical processing and optional joining mechanism steps in accordance with various disclosed aspects herein.
Figure 4:
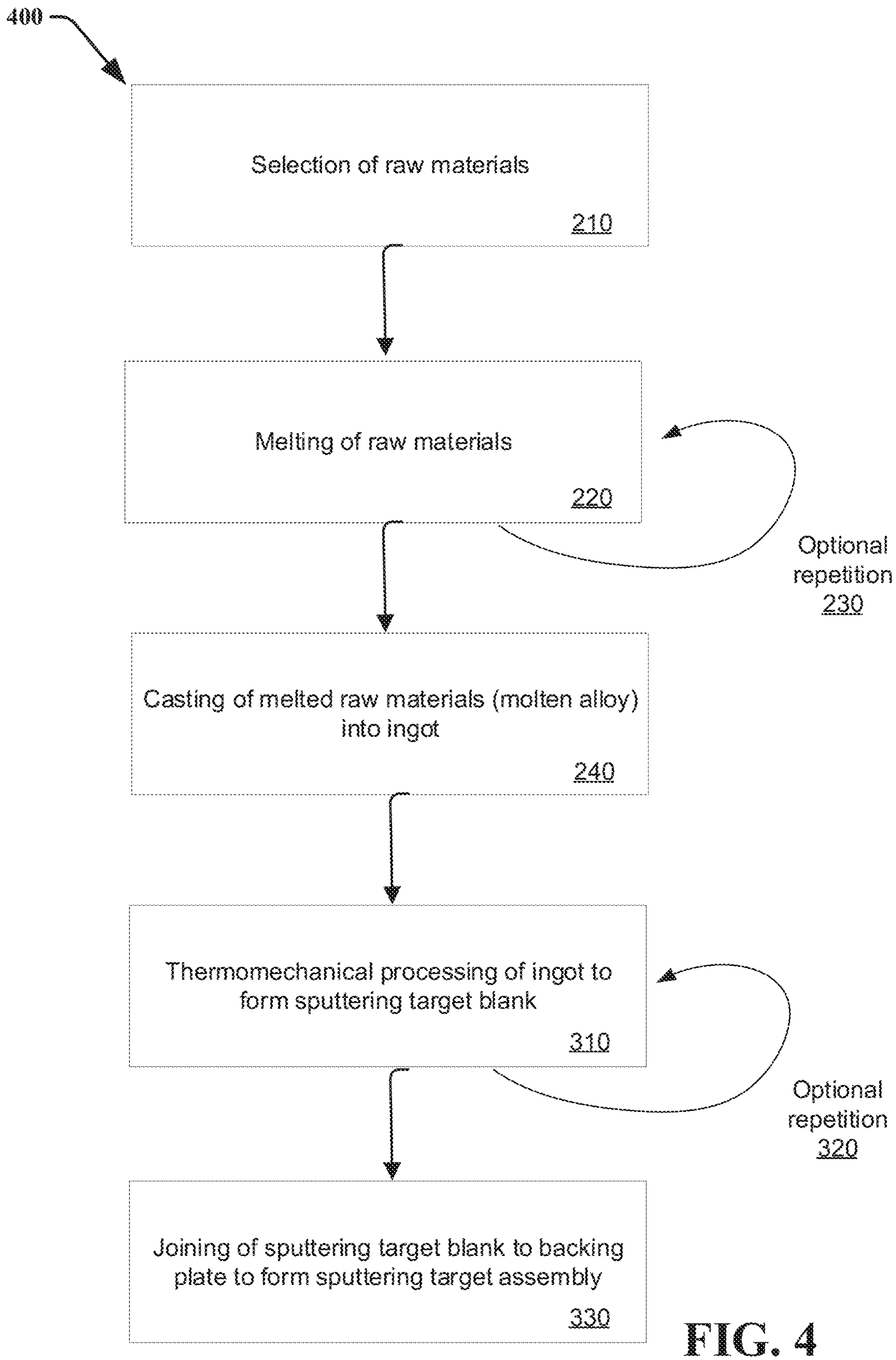
FIG. 4 is a flow diagram of an embodiment of a method of providing a copper-sulfur sputtering target blank and assembly in accordance with various disclosed aspects herein.
Figure 5:
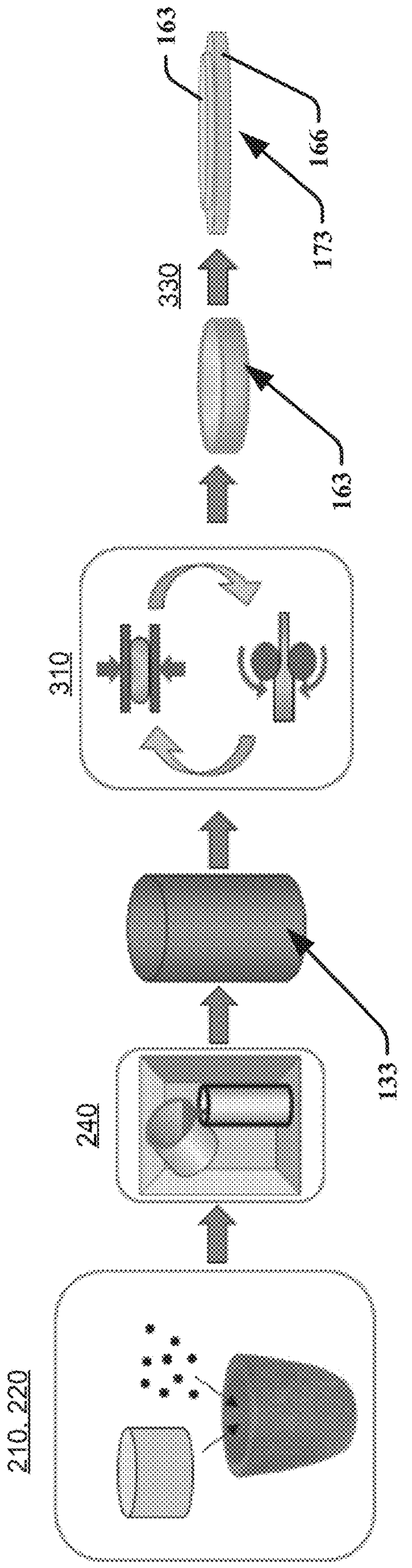
FIG. 5 is a schematic of an embodiment of a method of providing a copper-sulfur sputtering target blank and assembly in accordance with various disclosed aspects herein.

FIG. 2 shows an embodiment of a method 200 for forming an ingot (e.g., ingot 133 shown in FIGS. 6-7) from raw materials. FIG. 3 shows an embodiment of a method 300 for forming a sputtering target blank (e.g., sputtering target blank 163 shown in FIG. 8) from an ingot (e.g., ingot 133 shown in FIGS. 6-7). FIGS. 4-5 combine the foregoing methods to provide a method 400 for forming a sputtering target blank (e.g., sputtering target blank 163 shown in FIG. 8) from raw materials.

The method 200 may include a selection of raw materials 210. The selection of raw materials 210 may include copper and a secondary element or compound. In an embodiment, the copper may be selected to have a high purity. In an embodiment, the copper may have a purity of at least about 99.9999 wt % or higher. In an embodiment, approximately 6N of copper may be used. In an embodiment, the secondary element or compound may be sulfur. In an embodiment, the secondary element or compound may be a sulfur compound. The secondary element or compound may be selected to provide a copper alloy. In an embodiment, the copper alloy may be a copper-sulfur alloy. It is noted that the copper-sulfur alloy may also be referred to as a sulfur-doped copper alloy. In an embodiment, approximately 0.35-0.65 wt % of sulfur or a sulfur compound may be used.

After the selection of raw materials 210, the molten alloy, such as the copper alloy or copper-sulfur alloy, may be formed by a melting process 220. The melting process may include vacuum induction melting. The vacuum induction melting may be based on the specific raw material selection and defining optimal conditions for the melting processes. The melting process 220, or portions thereof, may be repeated at step 230. The repetition may be carried out for any number of cycles until a mixed, uniform, or generally homogenous molten alloy composition is formed. For example, the repetition may be carried out one, two, three, four, five, six, seven, eight, nine, ten, eleven, twelve, thirteen, fourteen, fifteen, or more cycles. For example, the repetition may be carried out for 1-5, 1-10, 1-15, 1-20, etc. cycles. The molten alloy composition may have one or more (or all) of: a high purity, a uniform distribution, and mechanical stability. The molten alloy composition may have a sulfur concentration up to 5 wt % and a purity of 99.999 wt % or higher. The molten alloy composition may have a uniform distribution of sulfur. The molten alloy composition may be capable of being formed into an ingot 133 without the fracturing and inconsistency found in the ingots shown in FIG. 1. The molten alloy composition may be capable of being cast into an ingot 133, without the fracturing and inconsistency found in the ingots shown in FIG. 1, due to the uniform distribution of sulfur within the molten alloy.

Figure 6:
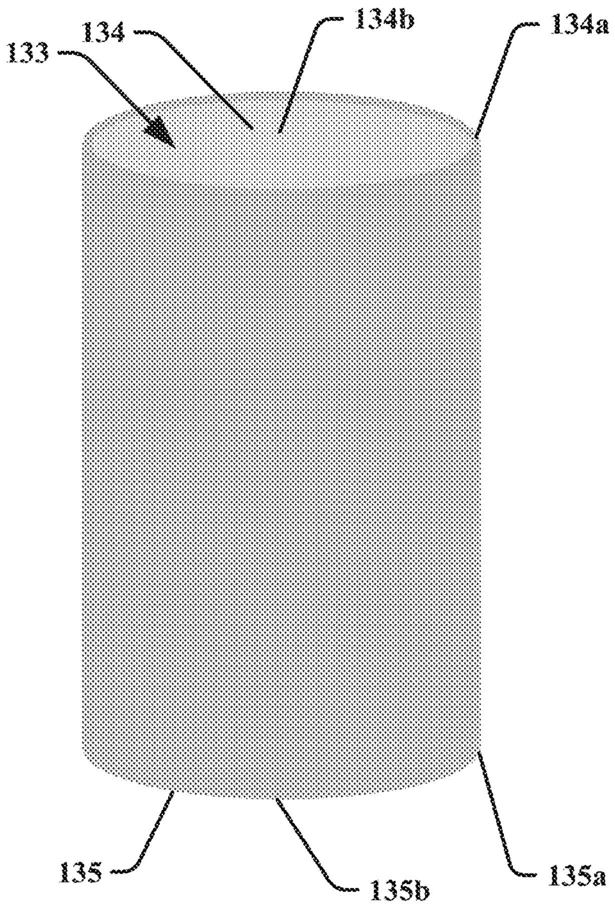
FIG. 6 shows an example of an ingot produced by described methods in accordance with various disclosed aspects herein.
Figure 7:
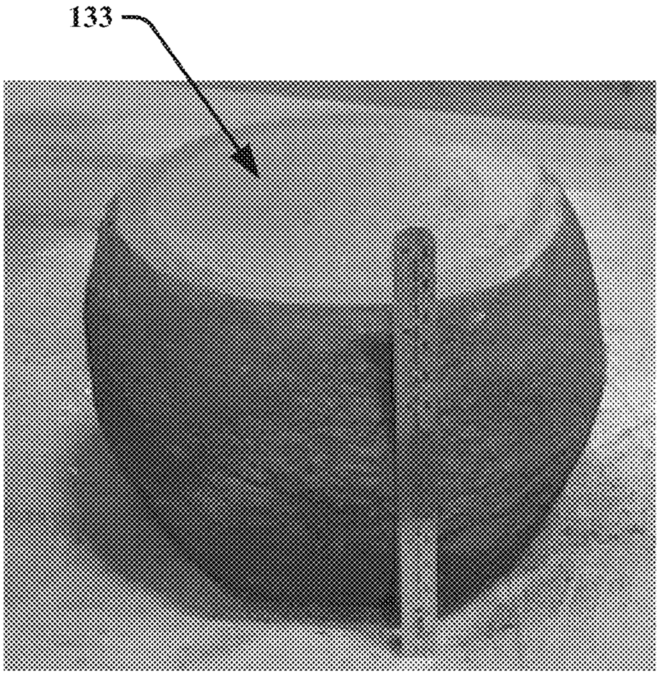
FIG. 7 shows an example of an ingot produced by described methods in accordance with various disclosed aspects herein.

After the molten alloy composition of raw materials, such as the copper alloy or copper-sulfur alloy composition, is formed, the molten alloy composition may be cast to provide an ingot at step 240. Exemplary ingots 133 are shown in FIG. 6-7. As is evident from the comparison of the ingot 133 in FIG. 7 of the present disclosure and the conventional ingot 10 shown in FIG. 1, the ingot 133 of the present disclosure has a uniform distribution, is generally homogenous, and does not present with fractures 15 or segregation. In an example, the sulfur concentration value at the top center **134*b* was measured at 0.47 wt %, the sulfur concentration value at the top outer diameter 134*a* was measured at 0.47 wt %, sulfur concentration value at the bottom center 135*b* was measured at 0.49 wt %, and the sulfur concentration value at the bottom outer diameter 135*a* was measured at 0.45 wt %. These measurements of the sulfur concentration values indicate general uniformity and even distribution of sulfur in the copper alloy composition and in the resulting ingot 133. The ingot 133 may have one or more (or all) of: a high purity, a uniform distribution, and mechanical stability. In some embodiments, the ingot 133** may have a sulfur concentration up to 5 wt % and a purity of 99.999 wt % or higher.

Some embodiments of ingots 133 may have a predetermined sulfur concentration value range throughout the ingot 133, such as between about 0.35-0.65 wt % sulfur throughout the ingot 133.

In some embodiments, the ingot 133 may have a variance in the sulfur concentration values that is less than or equal to a predetermined variance from a predetermined sulfur concentration value. In some embodiments, the predetermined variance may be less than or equal to about a 15% variance in the sulfur concentration values from a predetermined sulfur concentration value. In other embodiments, the predetermined variance of sulfur concentration values within ingot 133 may be less than or equal to about a 10% variance in the sulfur concentration values from a predetermined sulfur concentration value.

For example, in an exemplary embodiment, ingot 133 may have sulfur concentration values including and between 0.45-0.55 wt %, when the predetermined sulfur concentration value is 0.5 wt % sulfur, with a predetermined 10% variance in the sulfur concentration values from the predetermined sulfur concentration value. Further, ingot 133 may have sulfur concentration values including and between 0.425-0.575 wt % sulfur, when the predetermined sulfur concentration value is 0.5 wt % sulfur, with a 15% variance in the sulfur concentration values from the predetermined sulfur concentration value.

In some embodiments, ingot 133 may have sulfur concentration values less than or equal to about a predetermined percent difference threshold for sulfur concentration values throughout the ingot 133, such as a 30% difference threshold for sulfur concentration values throughout the ingot 133. In other embodiments, ingot 133 may have less than or equal to about 15% difference threshold for sulfur concentration values throughout the ingot 133.

For example, in an exemplary embodiment, the lowest sulfur concentration value ingot 133 may have is 0.45 wt % sulfur, when the highest sulfur concentration value in ingot 133 is 0.55 wt % sulfur and the predetermined percent difference threshold for sulfur concentration values throughout the ingot 133 is 20%. Likewise, the lowest sulfur concentration value ingot 133 may have is 0.425 wt % sulfur, when the highest sulfur concentration value in ingot 133 is 0.575 wt % sulfur and the predetermined percent difference threshold for sulfur concentration values throughout the ingot 133 is 30%.

In an embodiment, method 200 enables the combination elemental sulfur and sulfur containing compounds with copper during melting, such as by vacuum induction melting methods, based on specific raw material selection and defining optimal conditions for the melting processes with redundant combinations of the melting processes. In an embodiment, method 200 maintains the desired composition (e.g. high purity, uniform distribution, mechanical stability) and composition of the copper-sulfur alloy in the ingot 133.

Figure 8:
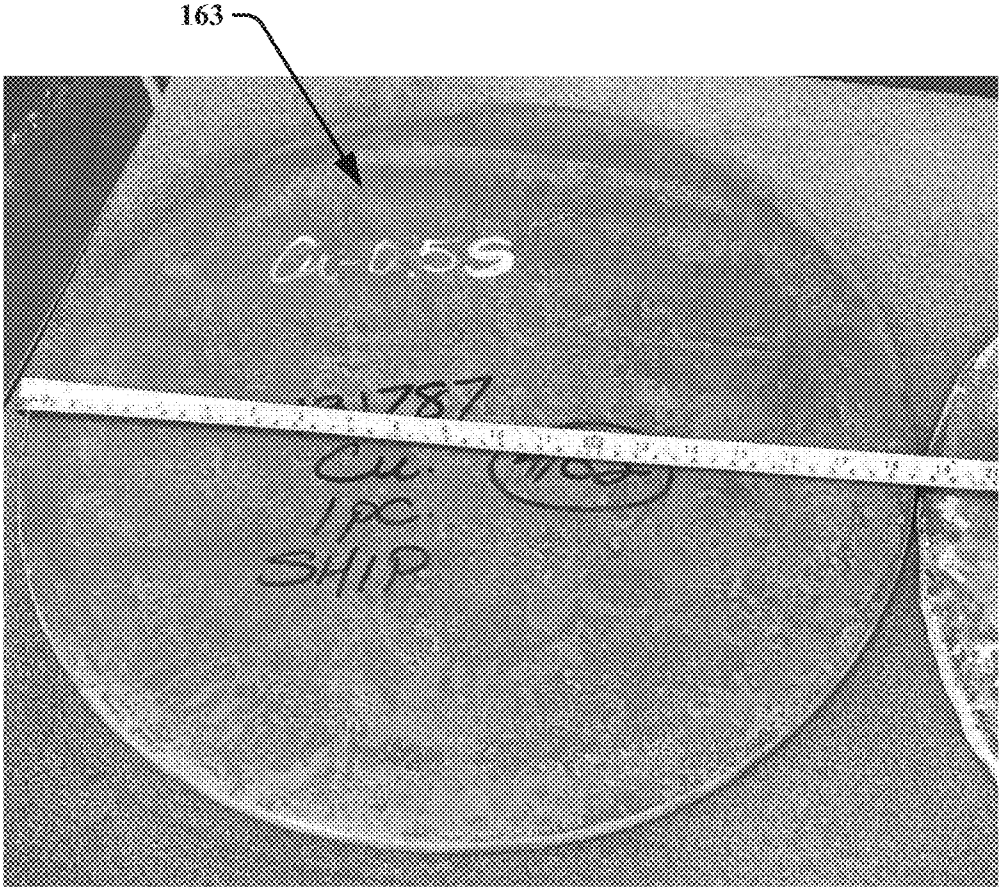
FIG. 8 shows an example of a sputtering target blank produced by described methods in accordance with various disclosed aspects herein.

Method 300 may be used separately from method 200 or may be used following method 200 as shown in FIGS. 4-5 as method 400. Method 300 may include thermomechanical processing 310, such as, but not limited to hot deformation, of the ingot 133 to form a sputtering target blank 163 (e.g., a target blank) which may then be joined to a backing plate 166 (forming, e.g., a target assembly 173). In an embodiment, the thermomechanical processing 310 may include hot deformation, In an embodiment, the thermomechanical processing 310 may include specific temperature and strain conditions. The temperature and strain conditions may be determined as those which are capable of forming the alloy ingot into a round or rectangular shaped plate, or other shaped plate, to provide a sputtering target blank 163. An example of a sputtering target blank 163 formed from the disclosed methods is shown in FIG. 8.

In an embodiment, the temperature for the thermomechanical process 310 may range from about 450-850° C. In an embodiment, the temperature for the thermomechanical process 310 may range from about 700-850° C. In an embodiment, the strain for the thermomechanical process 310 may comprise about 70-90% overall strain. In an embodiment, the strain for each repetition of the thermomechanical process 310 may introduce be more than about 10% or may be between about 15-20%. In an embodiment, the thermomechanical process 310 may include a combination of the temperature range of about 410-850° C. and strain condition of at least about 70-90% while maintaining a deformation percentage stable. In an embodiment, the thermomechanical process 310 may include a combination of the temperature range of about 700-850° C. of and strain condition of at least about 70-90% while maintaining a deformation percentage stable. The strain may be applied by rolls and rolling mechanisms, and/or presses and pressing mechanisms. The thermomechanical process 310, or portions thereof, may be repeated at step 320. The repetition may be carried out for any number of cycles until a desired sputtering target blank 163 is formed. For example, the repetition may be carried out one, two, three, four, five, six, seven, eight, nine, ten, eleven, twelve, thirteen, fourteen, fifteen, or more cycles. For example, the repetition may be carried out for 1-5, 1-10, 1-15, 1-20, etc. cycles. The sputtering target blank 163 may have one or more (or all) of: a high purity, a uniform distribution, and mechanical stability. The sputtering target blank 163 may have a sulfur concentration up to about 5 wt % and a purity of about 99.999 wt % or higher.

Similarly, as was discussed above in conjunction with ingots 133, the sputtering target blanks 163 of the present disclosure has a uniform distribution, is generally homogenous, and does not present with fractures 15 or segregation. In an example, the sulfur concentration value at the top center **134*b* was measured at 0.47 wt %, the sulfur concentration value at the top outer diameter 134*a* was measured at 0.47 wt %, sulfur concentration value at the bottom center 135*b* was measured at 0.49 wt %, and the sulfur concentration value at the bottom outer diameter 135*a* was measured at 0.45 wt %. These measurements of the sulfur concentration values indicate general uniformity and even distribution of sulfur in the copper alloy composition and in the resulting sputtering target blanks 163. The sputtering target blanks 163 may have one or more (or all) of: a high purity, a uniform distribution, and mechanical stability. In some embodiments, the sputtering target blanks 163** may have a sulfur concentration up to 5 wt % and a purity of 99.999 wt % or higher.

Further, sputtering target blanks 163 may have a predetermined sulfur concentration value range throughout the sputtering target blank 163, such as between about 0.35-0.65 wt % sulfur throughout the sputtering target blank 163.

In some embodiments, the sputtering target blank 163 may have a variance in the sulfur concentration values that is less than or equal to a predetermined variance from a predetermined sulfur concentration value. In some embodiments, the predetermined variance may be less than or equal to about a 15% variance in the sulfur concentration values from a predetermined sulfur concentration value. In other embodiments, the predetermined variance of sulfur concentration values within sputtering target blank 163 may be less than or equal to about a 10% variance in the sulfur concentration values from a predetermined sulfur concentration value.

For example, in an exemplary embodiment, sputtering target blank 163 may have sulfur concentration values including and between 0.45-0.55 wt %, when the predetermined sulfur concentration value is 0.5 wt % sulfur, with a predetermined 10% variance in the sulfur concentration values from the predetermined sulfur concentration value. Further, sputtering target blank 163 may have sulfur concentration values including and between 0.425-0.575 wt % sulfur, when the predetermined sulfur concentration value is 0.5 wt % sulfur, with a 15% variance in the sulfur concentration values from the predetermined sulfur concentration value.

In some embodiments, sputtering target blank 163 may have sulfur concentration values less than or equal to about a predetermined percent difference threshold for sulfur concentration values throughout the sputtering target blank 163, such as a 30% difference threshold for sulfur concentration values throughout the sputtering target blank 163. In other embodiments, sputtering target blank 163 may have less than or equal to about 15% difference threshold for sulfur concentration values throughout the sputtering target blank 163.

For example, in an exemplary embodiment, the lowest sulfur concentration value sputtering target blank 163 may have is 0.45 wt % sulfur, when the highest sulfur concentration value in sputtering target blank 163 is 0.55 wt % sulfur and the predetermined percent difference threshold for sulfur concentration values throughout the sputtering target blank 163 is 20%. Likewise, the lowest sulfur concentration value sputtering target blank 163 may have is 0.425 wt % sulfur, when the highest sulfur concentration value in sputtering target blank 163 is 0.575 wt % sulfur and the predetermined percent difference threshold for sulfur concentration values throughout the sputtering target blank 163 is 30%.

A sputtering target assembly 173 comprising a sputtering target blank 163 and backing plate 166 may be provided after the sputtering target blank 163 is acquired. The attachment of the sputtering target blank 163 to the backing plate 166 may include a joining process 330. The joining process 330 of the sputtering target blank 163 to the backing plate 166 may include solder bonding, brazing, mechanical methods, or diffusion bonding to produce a sputtering target assembly 173. The joining process 330 may be carried out without developing fractures and catastrophic cracking in the assembly 173, which may otherwise occur without the copper-sulfur alloy composition, ingots 133, and sputtering target blanks 163 provided by methods 200, 300, 400 of the present disclosure. The correct combination of temperature and strain applied during thermomechanical process 310 forms ingot 133 into a round or rectangular sputtering target blank 163 typical of those bonded to a backing plate 166 to form a sputtering target assembly 173, thereby permitting the sputtering target blank 163 to be joined to the backing plate 166 without the sputtering target blank 163 developing fractures and catastrophic cracking during the assembly process. In an embodiment, the backing plate 166 may be comprised of one or more of copper, copper alloys, copper-chromium based alloys, and/or copper-nickel-silicon-chromium based alloys. In an embodiment, the backing plate 166 may be copper. In an embodiment, the backing plate 166 may be a copper alloy. In an embodiment, the backing plate 166 may be copper-chromium based alloys. In an embodiment, the backing plate 166 may be copper-nickel-silicon-chromium based alloys.

The melt and cast ingot 133 produced by method 200, 400 requires composition uniformity and alloy conditions to enable further thermo-mechanical processing to form a sputtering target blank 163 by methods 300, 400 based on a sequence of required redundant processes and appropriate raw material selection. The combination of tailored casting, as well as alloy specific thermomechanical processing generate the required mechanical stability to produce a sputtering target assembly 173 with enhanced bond strength in the range of about 25 ksi-35 ksi, in an example.

As described, methods 200, 300, 400 can produce high purity sulfur-doped copper sputtering target blanks 163 with a sulfur concentration up to about 5 wt % having a purity of about 99.999 wt % or higher, uniform composition distribution, and mechanical stability to undergo the melting and casting process, the process including thermomechanical processes, and joining processes for joining sputtering target blank 163 to a backing plate 166 to form a target assembly 173 suitable for depositing thin films through PVD, such as Cu—S thin films. To deposit appropriate Cu—S films, the sputtering target blank 163 of the sputtering target assembly 173 may have a need for high chemical purity, uniform alloy distribution in the form of sulfur and sulfur containing compounds evenly distributed throughout the volume of the target and with the required mechanical stability to enable joining methods appropriate to produce the sputtering target assembly 173. The present disclosure relates to production of S-doped Cu sputtering target blanks 163 and sputtering target assemblies 173 used to form seed and copper interconnect layers in semiconductor applications to produce electronic devices. The method involves the process to melt and cast S-doped copper alloys with high purity and composition uniformity to form a sputtering target blank 163 that is joined to a backing plate 166 to form a sputtering target assembly 173 suitable for depositing thin films through PVD, such as Cu—S thin films.

What has been described above includes examples of the present specification. It is, of course, not possible to describe every conceivable combination of components or methodologies for purposes of describing the present specification, but one of ordinary skill in the art may recognize that many further combinations and permutations of the present specification are possible. Each of the components or methodologies described above may be combined or added together in any permutation to define the sputtering target blank 163, backing plate 166, sputtering target assembly 173, and methods for making thereof. Accordingly, the present specification is intended to embrace all such alterations, modifications and variations that fall within the spirit and scope of the appended claims. Furthermore, to the extent that the term "includes" is used in either the detailed description or the claims, such term is intended to be inclusive in a manner similar to the term "comprising" as "comprising" is interpreted when employed as a transitional word in a claim.

What is claimed is:

1. A method for producing a copper-sulfur alloy sputtering target assembly, comprising:

providing raw materials for forming a sputtering target, wherein the raw materials comprise copper, and the raw materials further comprise sulfur and/or sulfur compounds;

melting the raw materials to produce a molten alloy, casting the molten alloy composition to produce an ingot having a predetermined uniform sulfur distribution value throughout the ingot, applying thermomechanical processing at a predetermined temperature to the ingot to produce a sputtering target blank, and forming a sputtering target assembly by joining the sputtering target blank to a backing plate;

wherein the molten alloy and the ingot have a purity of about 99.999 wt % or higher, wherein the ingot has a predetermined sulfur concentration value range, a predetermined variance in the sulfur concentration values from a predetermined sulfur concentration value, and a percentage difference for the sulfur concentration values is less than or equal to about a predetermined percent difference threshold for sulfur concentration values throughout the ingot, wherein the predetermined sulfur concentration value range is between and includes about 0.35-0.65 wt % sulfur throughout the ingot, the predetermined variance in the sulfur concentration values is about 15% or less, and the predetermined percent difference threshold for sulfur concentration values is about 30% or less.

2. The method of claim 1, wherein the predetermined temperature of the thermomechanical processing is greater than about 450° C.

3. The method of claim 2, wherein the predetermined temperature of the thermomechanical processing is between about 700-850° C.

4. The method of claim 1, wherein the raw materials are melted by vacuum induction melting.

5. The method of claim 1, wherein the sputtering target blank is joined to the backing plate using at least one or more of solder bonding, brazing, mechanical methods, or diffusion bonding.

6. The method of claim 1, wherein a bond strength between the sputtering target blank and the backing plate of the sputtering target assembly is between about 25 ksi-35 ksi.

7. The method of claim 1, wherein the backing plate comprises at least one material selected from the group consisting of copper and copper alloys.

8. The method of claim 1, wherein the raw material is comprised of up to about 5 wt % sulfur.

9. The method of claim 1, wherein the sulfur is uniformly distributed in the molten raw material, ingot, and sputtering target.

10. The method of claim 1, wherein the melting is repeated to produce the ingot.

11. The method of claim 1, wherein the predetermined variance in the sulfur concentration values is about 10% or less, and predetermined percent difference threshold for sulfur concentration values is about 15% or less.

12. A method for producing a copper-sulfur alloy sputtering target assembly, comprising:

providing raw materials for forming a sputtering target, wherein the raw materials comprise copper, and the raw materials further comprise sulfur and/or sulfur compounds;

melting the raw materials to produce a molten alloy, casting the molten alloy composition to produce an ingot having a predetermined uniform sulfur distribution value throughout the ingot, applying thermomechanical processing at a predetermined temperature to the ingot to produce a sputtering target blank, and forming a sputtering target assembly by joining the sputtering target blank to a backing plate;

wherein the molten alloy and the ingot have a purity of about 99.999 wt % or higher, wherein the thermomechanical processing is repeated until the overall strain condition in the sputtering target blank reaches a predetermined value;

wherein the thermomechanical processing includes one or both of pressing and rolling;

wherein the predetermined value of the overall strain condition in the sputtering target is between about 70-90%.

13. The method of claim 12, wherein the thermomechanical processing increases the overall strain condition within the sputtering target blank by about 15-20% during each repetition of the thermomechanical processing.

14. The method of claim 12, wherein the predetermined temperature of the thermomechanical processing is greater than about 450° C.

15. The method of claim 14, wherein the predetermined temperature of the thermomechanical processing is between about 700-850° C.

16. The method of claim 12, wherein:

the raw materials are melted by vacuum induction melting; and/or the sputtering target blank is joined to the backing plate using at least one or more of solder bonding, brazing, mechanical methods, or diffusion bonding; and/or a bond strength between the sputtering target blank and the backing plate of the sputtering target assembly is between about 25 ksi-35 ksi; and/or the backing plate comprises at least one material selected from the group consisting of copper and copper alloys; and/or the raw material is comprised of up to about 5 wt % sulfur; and/or the sulfur is uniformly distributed in the molten raw material, ingot, and sputtering target; and/or the melting is repeated to produce the ingot.

17. The method of claim 12, wherein the ingot has a predetermined sulfur concentration value range, a predetermined variance in the sulfur concentration values from a predetermined sulfur concentration value, and a percentage difference for the sulfur concentration values is less than or equal to about a predetermined percent difference threshold for sulfur concentration values throughout the ingot;

wherein the predetermined variance in the sulfur concentration values is about 10% or less, and predetermined percent difference threshold for sulfur concentration values is about 15% or less.

18. A method for producing a copper-sulfur alloy sputtering target assembly, comprising:

providing raw materials for forming a sputtering target, wherein the raw materials comprise copper, and the raw materials further comprise sulfur and/or sulfur compounds;

melting the raw materials to produce a molten alloy, casting the molten alloy composition to produce an ingot having a predetermined uniform sulfur distribution value throughout the ingot, applying thermomechanical processing at a predetermined temperature to the ingot to produce a sputtering target blank, and forming a sputtering target assembly by joining the sputtering target blank to a backing plate;

wherein the molten alloy and the ingot have a purity of about 99.999 wt % or higher, wherein the thermomechanical processing is repeated until the overall strain condition in the sputtering target blank reaches a predetermined value;

wherein the thermomechanical processing includes one or both of pressing and rolling;

wherein the thermomechanical processing increases the overall strain condition within the sputtering target blank by atleast about 10% during each repetition of the thermomechanical processing.

19. The method of claim 18, wherein the predetermined temperature of the thermomechanical processing is greater than about 450° C.

20. The method of claim 19, wherein the predetermined temperature of the thermomechanical processing is between about 700-850° C.

21. The method of claim 18, wherein:

the raw materials are melted by vacuum induction melting; and/or the sputtering target blank is joined to the backing plate using at least one or more of solder bonding, brazing, mechanical methods, or diffusion bonding; and/or a bond strength between the sputtering target blank and the backing plate of the sputtering target assembly is between about 25 ksi-35 ksi; and/or the backing plate comprises at least one material selected from the group consisting of copper and copper alloys; and/or the raw material is comprised of up to about 5 wt % sulfur; and/or the sulfur is uniformly distributed in the molten raw material, ingot, and sputtering target; and/or the melting is repeated to produce the ingot.

22. The method of claim 18, wherein the ingot has a predetermined sulfur concentration value range, a predetermined variance in the sulfur concentration values from a predetermined sulfur concentration value, and a percentage difference for the sulfur concentration values is less than or equal to about a predetermined percent difference threshold for sulfur concentration values throughout the ingot;

wherein the predetermined variance in the sulfur concentration values is about 10% or less, and predetermined percent difference threshold for sulfur concentration values is about 15% or less.

* * * * *